US008360201B2

(12) United States Patent
Tanase

(10) Patent No.: US 8,360,201 B2
(45) Date of Patent: Jan. 29, 2013

(54) SOUND ABSORBING STRUCTURE AND SOUND CHAMBER

(75) Inventor: Rento Tanase, Iwata (JP)

(73) Assignee: Yamaha Corporation, Hamamatsu-Shi, Shizuoka-ken (JP)

( * ) Notice: Subject to any disclaimer, the term of this patent is extended or adjusted under 35 U.S.C. 154(b) by 0 days.

(21) Appl. No.: 12/248,733

(22) Filed: Oct. 9, 2008

(65) Prior Publication Data

US 2009/0120717 A1 May 14, 2009

(30) Foreign Application Priority Data

Oct. 11, 2007 (JP) ................................ 2007-265554

(51) Int. Cl.
*E04B 1/82* (2006.01)
*E04B 1/00* (2006.01)
*E04B 9/00* (2006.01)
*H05K 5/00* (2006.01)
*G10K 11/00* (2006.01)

(52) U.S. Cl. ........ 181/291; 181/151; 181/175; 181/284; 181/286; 181/292; 181/295; 52/126.6; 52/263

(58) Field of Classification Search .................. 181/291, 181/284, 151, 175, 286, 292, 295; 52/126.6, 52/263
See application file for complete search history.

(56) References Cited

U.S. PATENT DOCUMENTS 2,185,023 A 12/1939 Crane
2,541,159 A 2/1951 Geiger
2,796,636 A 6/1957 Heerwagen
3,851,724 A 12/1974 Banks, Jr.
3,876,034 A 4/1975 Antonini
4,130,175 A * 12/1978 Hehmann ..................... 181/290
4,177,876 A 12/1979 Pujolle
4,371,858 A 2/1983 Kanoi et al.
(Continued)

FOREIGN PATENT DOCUMENTS

CN 2272469 Y 1/1998
JP 5-231177 9/1993
(Continued)

OTHER PUBLICATIONS

JIS A 1409; "Method for measurement of sound absorption coefficients in a reverberation.room"; Published by Japanese Industrial Standard, Dec. 20, 2008, Mislabeled in Palm as Transmittal Letter on Jul. 30, 2010.

(Continued)

*Primary Examiner* — Elvin G Enad
*Assistant Examiner* — Christina Russell
(74) *Attorney, Agent, or Firm* — Dickstein Shapiro LLP

(57) ABSTRACT

A sound absorber is formed by covering the opening of a housing with a vibration member having a flat shape or a film shape so as to define an air layer therebetween. The sound absorber is attached to the wall of a room such that the vibration member is positioned opposite to the wall with a prescribed space therebetween. Sound generated in the room particularly in low frequencies enters into the space between the vibration member and the wall so as to cause vibration of the vibration member due to the pressure difference between the sound pressure applied to the space and the internal pressure of the air layer, thus consuming energy of sound waves. Thus, it is possible to efficiently absorb low-frequency sound with a reduced thickness of the air layer.

6 Claims, 12 Drawing Sheets

U.S. PATENT DOCUMENTS

| | | | | |
|---|---|---|---|---|
| 4,373,608 | A | 2/1983 | Holmes | |
| 4,442,419 | A | 4/1984 | Kanoi et al. | |
| 4,538,697 | A | 9/1985 | Muroi et al. | |
| 4,558,296 | A | 12/1985 | Thoren | |
| 4,782,913 | A * | 11/1988 | Hoffmann et al. | 181/286 |
| 4,815,050 | A * | 3/1989 | Kurz | 367/176 |
| 4,850,163 | A * | 7/1989 | Kobayashi et al. | 52/126.6 |
| 5,042,569 | A * | 8/1991 | Siegmund | 165/56 |
| 5,138,588 | A * | 8/1992 | Chuan et al. | 367/176 |
| 5,210,720 | A * | 5/1993 | Caprette et al. | 367/176 |
| 5,501,754 | A * | 3/1996 | Hiraguri | 156/71 |
| 5,521,341 | A | 5/1996 | Stief et al. | |
| 5,587,564 | A * | 12/1996 | Stief et al. | 181/295 |
| 5,740,649 | A * | 4/1998 | Fuchs et al. | 52/506.06 |
| 5,905,234 | A * | 5/1999 | Tsukamoto et al. | 181/286 |
| 5,975,238 | A * | 11/1999 | Fuchs et al. | 181/295 |
| 6,021,612 | A * | 2/2000 | Dunn et al. | 52/144 |
| 6,101,768 | A * | 8/2000 | Springstead et al. | 52/126.6 |
| 6,167,985 | B1 | 1/2001 | Van Ligten | |
| 6,290,022 | B1 * | 9/2001 | Wolf et al. | 181/292 |
| 6,463,704 | B1 * | 10/2002 | Jette | 52/125.2 |
| 6,478,110 | B1 * | 11/2002 | Eatwell et al. | 181/207 |
| 6,525,931 | B2 | 2/2003 | Yagenji et al. | |
| 6,568,135 | B1 * | 5/2003 | Yokoyama et al. | 52/145 |
| 6,638,640 | B2 * | 10/2003 | Jee | 428/594 |
| 6,739,425 | B1 * | 5/2004 | Griffin et al. | 181/171 |
| 6,789,645 | B1 * | 9/2004 | Deblander | 181/290 |
| 6,988,057 | B2 | 1/2006 | Huang et al. | |
| 7,267,196 | B2 * | 9/2007 | Mathur | 181/208 |
| 7,395,898 | B2 * | 7/2008 | Yang et al. | 181/286 |
| 7,454,869 | B2 * | 11/2008 | Owen | 52/263 |
| 7,520,096 | B2 * | 4/2009 | Hiraguri et al. | 52/263 |
| 7,540,353 | B2 | 6/2009 | Okawa et al. | |
| 2003/0167710 | A1 * | 9/2003 | Tanase et al. | 52/220.1 |
| 2004/0055813 | A1 * | 3/2004 | Tsuiki et al. | 181/204 |
| 2005/0051381 | A1 | 3/2005 | Imai | |
| 2005/0098379 | A1 * | 5/2005 | Sato et al. | 181/293 |
| 2005/0155815 | A1 | 7/2005 | Sasaki et al. | |
| 2005/0189165 | A1 * | 9/2005 | Mathur | 181/207 |
| 2005/0194209 | A1 * | 9/2005 | Yang et al. | 181/286 |
| 2007/0017739 | A1 * | 1/2007 | Yamagiwa et al. | 181/209 |
| 2007/0140518 | A1 * | 6/2007 | Larsen | 381/354 |
| 2007/0151796 | A1 | 7/2007 | Heid | |
| 2007/0284185 | A1 * | 12/2007 | Foss | 181/207 |
| 2008/0093164 | A1 * | 4/2008 | Hiyama et al. | 181/288 |
| 2008/0128200 | A1 * | 6/2008 | Tsugihashi et al. | 181/284 |
| 2008/0128202 | A1 * | 6/2008 | Palumbo et al. | 181/292 |
| 2008/0135327 | A1 * | 6/2008 | Matsumura et al. | 181/151 |
| 2008/0164093 | A1 * | 7/2008 | Hirai et al. | 181/290 |
| 2009/0084627 | A1 * | 4/2009 | Tsugihashi et al. | 181/290 |
| 2009/0120717 | A1 * | 5/2009 | Tanase | 181/284 |
| 2009/0201102 | A1 * | 8/2009 | Oda | 333/193 |
| 2009/0205901 | A1 * | 8/2009 | Tanase et al. | 181/151 |
| 2010/0044148 | A1 * | 2/2010 | Tanase | 181/198 |
| 2010/0089691 | A1 | 4/2010 | Nakamura et al. | |

FOREIGN PATENT DOCUMENTS

| | | | |
|---|---|---|---|
| JP | 06-083365 | A | 3/1994 |
| JP | 08-068018 | A | 3/1996 |
| JP | 09-143936 | A | 6/1997 |
| JP | 2006-011412 | A | 1/2006 |
| JP | 2009167701 | A | 7/2009 |
| JP | 2009255908 | A | 11/2009 |
| JP | 2009288355 | A | 12/2009 |
| JP | 2009293252 | A | 12/2009 |
| JP | 2009293271 | A | 12/2009 |

OTHER PUBLICATIONS

Japanese Office Action corresponding to Application No. 2008-255155, mailing date Aug. 21, 2012 (with English translation).

Sho Kimura; "Architerctural Acoustics and Noise Insulation Plans"; Shokokokusha Kabushiki Kaisha, Feb. 20, 1981, pp. 150-151, (English translation attached).

Yoichi Kobori; "Practical Vibration Calculation Method"; Publisher: Kougaku-Tosho Kabushiki Kaisha, Version 6, Nov. 25, 1988, pp. 213.

JIS A 1405-2; "Acoustics—Determination of sound absorption coefficient and impedance in impedance tubes—Part 2: Transfer-function method"; Published by Japanese Industrial Standard, Apr. 20, 2007.

JIS A 1409; "Method for measurement of sound absorption coefficients in a reverberation room"; Published by Japanese Industrial Standard, Dec. 20, 2008.

* cited by examiner

SOUND ABSORBING STRUCTURE AND SOUND CHAMBER

BACKGROUND OF THE INVENTION

1. Field of the Invention

The present invention relates to sound absorbing structures for absorbing sounds in sound chambers.

The present application claims priority on Japanese Patent Application No. 2007-265554, the content of which is incorporated herein by reference.

2. Description of the Related Art

Various types of sound absorbing structures having air layers between sound absorbers and walls of chambers (or rooms) have been developed and are disclosed in various documents such as Patent Document 1.

Patent Document 1: Japanese Unexamined Patent Application Publication No. H05-231177

Patent Document 1 teaches a soundproof device having a sound absorbing structure, wherein a sound absorbing panel, in which square-shaped sound absorbers composed of ceramics are aligned to form irregular surfaces (having recesses and projections), is disposed to form an air layer with a side wall. In this sound absorbing structure, sound propagated toward the wall from the inside of a room is absorbed by sound absorbers while sound transmitted through sound absorbers is attenuated in energy by way of the air layer formed in the backside of sound absorbers; hence, it is possible to efficiently absorb sound.

In order to absorb low-frequency sound by use of sound absorbers composed of "porous" materials such as ceramics as disclosed in Patent Document 1, it is necessary to increase the thickness of an air layer formed between the sound absorbing panel and the wall. However, the space used for purposes other than sound absorbing in a room should be reduced due to the "large" thickness of the air layer. This makes it difficult to form an air layer having an adequate thickness.

SUMMARY OF THE INVENTION

It is an object of the present invention to provide a sound absorbing structure which is capable of efficiently absorbing low-frequency sound with a reduced thickness of an air layer.

It is another object of the present invention to provide a sound chamber having the sound absorbing structure.

The present invention is directed to a sound absorbing structure including at least one sound absorber constituted of a housing having an opening and a vibration member, which is arranged on the opening so as to form a cavity in the housing; a room having a boundary, in which the sound absorber is arranged on the boundary such that the vibration member faces the boundary; and a space which is formed above the vibration member so as to communicate with the room.

In the above, it is possible to form irregularities on the exterior surface of the housing.

It is possible to form a curvature on the exterior surface of the housing.

It is possible to attach a porous layer composed of a porous material to the exterior surface of the housing.

It is possible to arrange a plurality of sound absorbers which are arranged to adjoin together with a prescribed distance therebetween.

In the above, all the exterior surfaces of the sound absorbers, which are positioned opposite to the boundary of the room, can be covered with a material having acoustic transmissivity and acoustic flow resistance.

In addition, the sound absorber is fixed to the boundary of the room by a fixing member with an adjustable distance therebetween.

The sound absorbing structure can be applied to sound chambers and various instruments and devices.

The sound absorbing structure of the present invention can efficiently absorb sound particularly in low frequencies, wherein the air layer of the sound absorber can be reduced in thickness.

BRIEF DESCRIPTION OF THE DRAWINGS

These and other objects, aspects, and embodiments of the present invention will be described in more detail with reference to the following drawings.

DESCRIPTION OF THE PREFERRED EMBODIMENTS

The present invention will be described in further detail by way of examples with reference to the accompanying drawings.

1. First Embodiment

Figure 1:
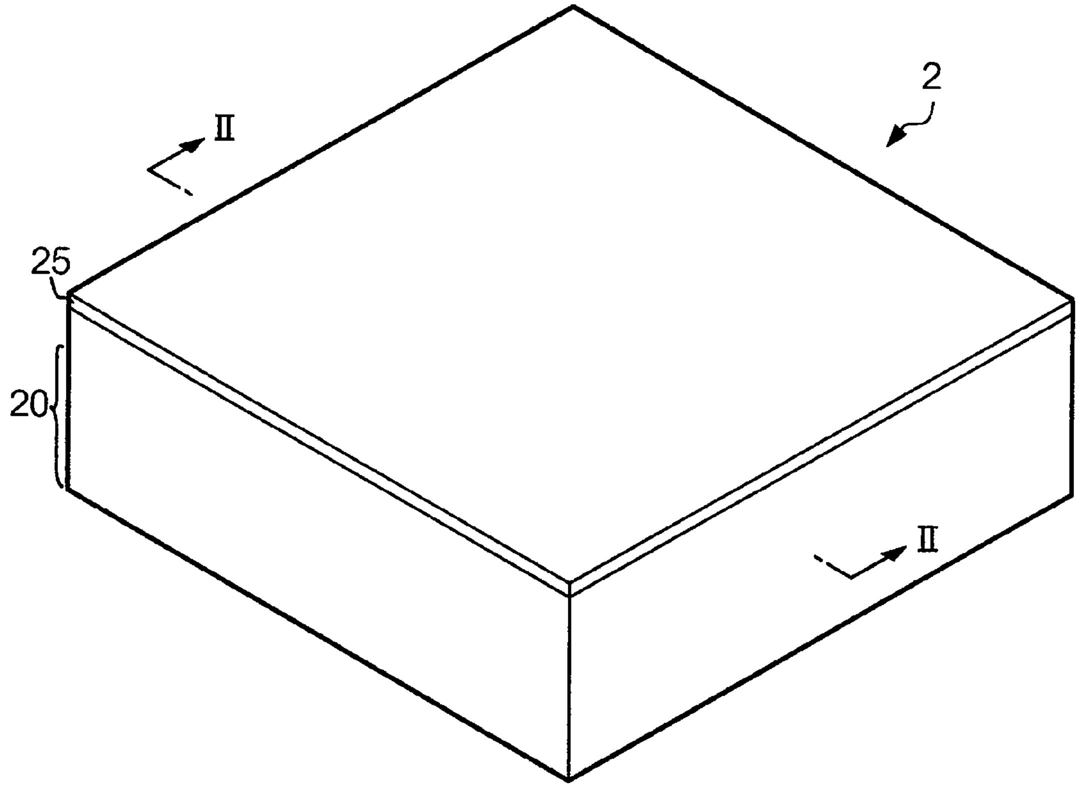
FIG. 1 is a perspective view showing the exterior of a sound absorber in accordance with a first embodiment of the present invention.
Figure 2:
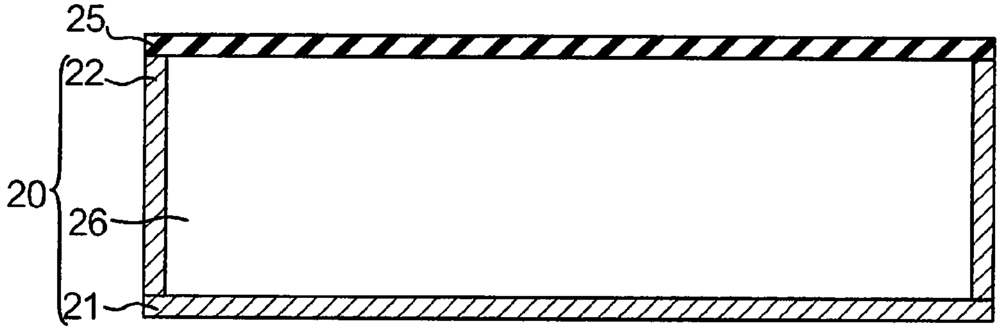
FIG. 2 is a cross-sectional view of the sound absorber taken along line II-II in FIG. 1.

FIG. 1 is a perspective view showing the exterior of a sound absorber in accordance with the first embodiment of the present invention; FIG. 2 is a cross-sectional view of the sound absorber 2 taken along line II-II in FIG. 1. The sound absorber 2 is constituted of a housing 20 and a vibration member 25. The housing 20 is composed of wooden materials and is constituted of a bottom member 21 (corresponding to the bottom of the sound absorber 2) having a rectangular shape and a side wall member 22 (forming the side wall of the housing 20), thus forming an internal space which allows the vibration member 25 to vibrate. The side wall member 22 is a rectangular timber having openings, wherein the edge of one opening thereof is fixed to the bottom member 21. The housing 20 is not necessarily composed of wooden materials but can be formed using other materials such as synthetic resins and metals having high rigidities enough for the vibration member 25 to vibrate.

The vibration member 25 is a rectangular plate composed of elastic materials. The vibration member 25 is bonded to the edge of another opening of the side wall member 22 opposite to the bottom member 21, the opening of the housing 20 is closed with the vibration member 25 so that a closed air layer 26 is formed inside of the sound absorber 2. The vibration member 25 is not necessarily formed using the rectangular board but can be formed using films composed of elastic materials or other films composed of high polymers.

Figure 3:
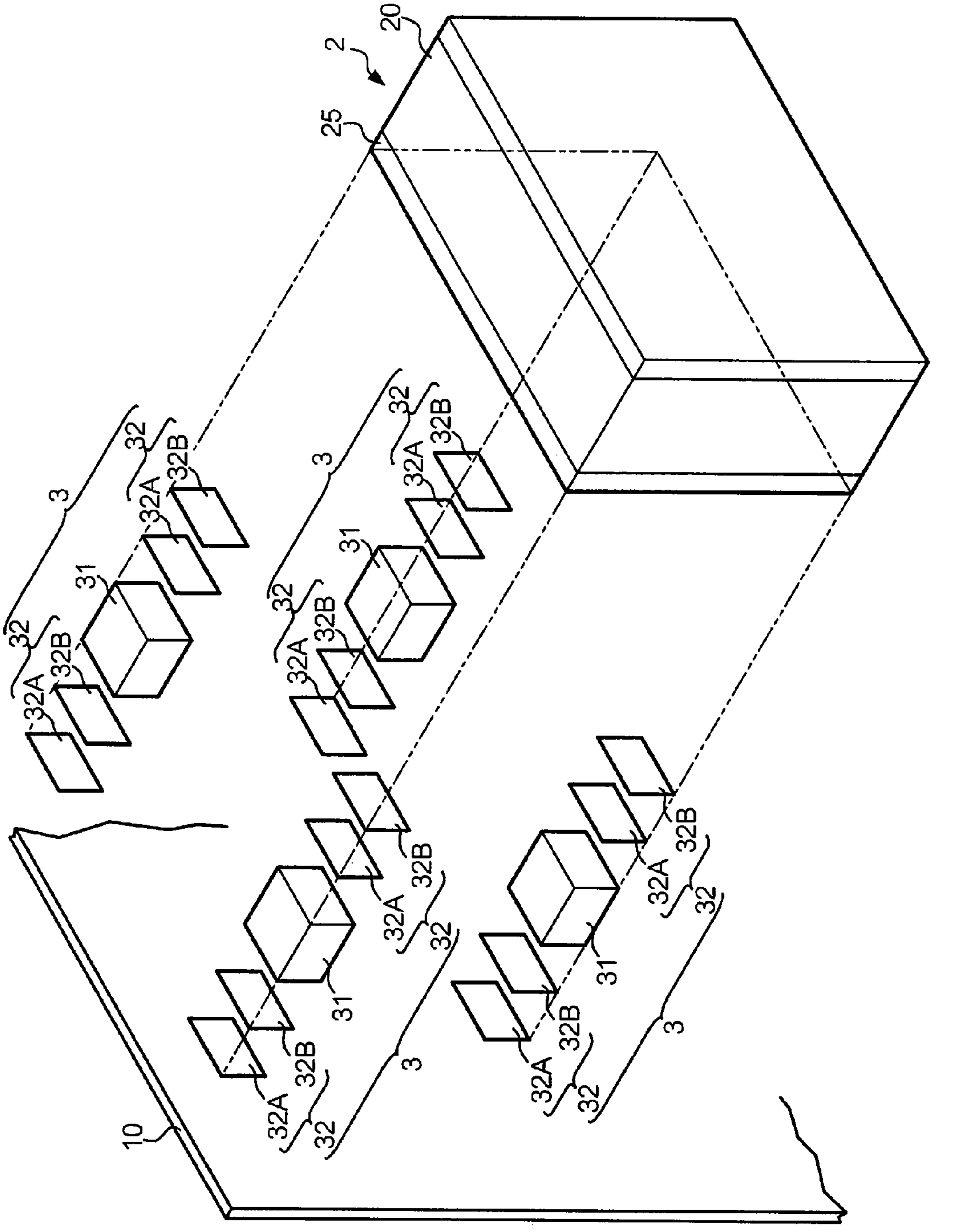
FIG. 3 is an exploded view of fixing members used for fixing the sound absorber onto a wall.

The sound absorber 2 is fixed to a wall (or a boundary) of a room (or a chamber) forming a sound field in such a way that the vibration member 25 faces the boundary of the room so as to form a space therebetween. FIG. 3 is an exploded view of fixing members 3 which are used to fix the sound absorber 2 to a wall (or a boundary) 10 of a room. The fixing member 3 includes a support member 31 having a square prism shape composed of a synthetic resin. The fixing member 3 also includes plane fasteners 32, each of which is constituted of a hooked section 32A (i.e. a cloth having hooked projections formed in the entire surface) and a piled section 32B (i.e. a piled cloth). The hooked section 32A is adhered to one of the opposite surfaces of the support member 31 while the piled section 32B is adhered to the other surface.

The piled sections 32B are adhered to four corners of the vibration member 25 of the sound absorber 2 while the hooked sections 32A are adhered to the fixing positions of the wall 10 which precisely match four corners of the vibration member 25 when the vibration member 25 is positioned to face a fixing area for fixing the sound absorber 2 to the wall 10.

In the fixing operation for fixing the sound absorber 2 to the wall 10, the piled sections 32B adhered to the fixing members 3 are positioned to face the hooked sections 32A which are adhered to the wall 10 in advance, whereby the hooked projections of the hooked sections 32A engage with the piled sections 32B so that the fixing members 3 are fixed to the wall 10. Next, the piled sections 32B adhered to four corners of the sound absorber 2 are positioned to face the hooked sections 32A which are adhered to the fixing members 3 fixed to the wall 10 in advance, whereby hooked projections of the hooked sections 32A engage with the piled sections 32B which are adhered to four corners of the vibration member 25. Thus, the sound absorber 2 is fixed to the wall 10 in such a way that a space S whose thickness substantially matches the heights of the fixing members 3 is formed between the vibration member 25 and the wall 10. As described above, the sound absorbing structure of the present embodiment is characterized in that the vibration member 25 of the sound absorber 2 is isolated in a position from the wall 10 via the space S.

When sound is generated in a room (or a chamber) in which the sound absorber 2 is fixed to the wall 10 in such a way that the space S is formed between the vibration member 25 and the wall 10, low-frequency sound waves enter into the space S formed between the vibration member 25 and the wall 10. Due to sound waves entering into the space S between the vibration member 25 and the wall 10, the vibration member 25 vibrates based on the pressure difference between the sound pressure applied to the space S and the internal pressure of the air layer 26 of the sound absorber 2, wherein energy of sound waves entering into the space S is consumed by the vibration of the vibration member 25 so that sound is absorbed by the sound absorber 2. The space S is defined by two boundaries, i.e. the vibration member 25 and the wall 10; hence, the sound pressure applied thereto becomes higher in comparison with the situation in which the sound absorber 2 is not arranged in a room, wherein a relatively high energy of sound waves is propagated to the vibration member 25, thus improving the sound absorption efficiency.

Next, setting conditions of the sound absorber will be described below.

Generally speaking, in the sound absorbing structure for absorbing sound by use of an air layer formed in a cavity and a vibration member (e.g. a vibration plate or a vibration film), a frequency to damp vibration depends upon a resonance frequency of a spring-mass system defined by a mass of the vibration member and a spring coefficient of the air layer in the cavity. By use of an air density $\rho_0$ [kg/m$^3$], a sound velocity $c_0$ [m/s], a density $\rho$ [kg/m$^3$] of the vibration member, a thickness t [m] of the vibration member, and a thickness L [m] of the air layer in the cavity, the resonance frequency of the spring-mass system is expressed by equation (1).

$$f = \frac{1}{2\pi}\left(\frac{\rho_0 c_0^2}{\rho t L}\right)^{1/2} \tag{1}$$

The property of a bending system derived from elastic vibration may be added to the plate/film-vibration-type sound absorbing structure in which the vibration member having elasticity is elastically vibrated. In the field of architectural acoustics, the resonance frequency of the plate/film-vibration-type sound absorbing structure having a rectangular-shaped vibration member is expressed by equation (2) by use of one-side length "a" [m] and another-side length "b" [m] of the vibration member, a Young's modulus E [Pa], and a Poisson's ratio $\sigma$ [−] as well as positive integers p and q. In the case of a simple support boundary condition of a structure, the calculated resonance frequency can be used for acoustics designs, for example.

$$f = \frac{1}{2\pi}\left[\frac{\rho_0 c_0^2}{\rho t L} + \left\{\left(\frac{p}{a}\right)^2 + \left(\frac{q}{b}\right)^2\right\}^2 \left\{\frac{\pi^4 E t^3}{12\rho t(1-\sigma^2)}\right\}\right]^{1/2} \quad (2)$$

In the present embodiment, the following parameters are determined in order to absorb sound with respect to center frequencies of one-third octave bands ranging from 160 Hz to 315 Hz.

Air density $\rho_0$: 1.225 [kg/m$^3$]
Sound velocity $c_0$: 340 [m/s]
Density ρ of vibration member: 940 [kg/m$^3$]
Thickness t of vibration member: 0.0017 [m]
Thickness L of air layer: 0.03 [m]
Length "a" of housing: 0.1 [m]
Length "b" of housing: 0.1 [m]
Young's modulus E of vibration member: 0.64 [GPa]
Poisson's ratio σ:0.4
Mode degree: p=q=1

In equation (2), the term of a spring-mass system "$\rho_0 c_0^2/\rho t L$" is added to the following term, i.e. the term of a bending system. For this reason, the resonance frequency calculated by equation (2) should be higher than the resonance frequency calculated with respect to the spring-mass system; hence, it is difficult to lower peak frequencies in sound absorption.

The relation between the resonance frequency of the spring-mass system and the resonance frequency of the bending system (caused by elastic vibration due to elasticity of the plate) has not been clearly analyzed; hence, in actuality, specific structures adapted to sound absorbers (which have high sound absorption in low frequencies) have not been established.

The inventor of the present invention performed various experiments so as to assert that the above parameters should be determined to suit the condition defined by equation (3) in which fa designates a fundamental frequency of vibration in the bending system and is expressed by the following equation, and fb designates a resonance frequency of the spring-mass system (see equation (1)).

$$fa = \frac{1}{2\pi} \cdot \left\{\left(\frac{p}{a}\right)^2 + \left(\frac{q}{b}\right)^2\right\} \cdot \left\{\frac{\pi^4 E t^3}{12\rho t(1-\sigma^2)}\right\}^{1/2}$$

That is, the fundamental vibration of the bending system is interlinked with the spring coefficient of the air layer in the cavity (positioned in the backside of the bending system), whereby a vibration having a relatively large amplitude is caused in a prescribed band between the resonance frequency of the spring-mass system and the fundamental frequency of the bending system so as to improve sound absorption coefficients; that is, (fundamental frequency fa of bending system)<(peak frequency f of sound absorption)<(resonance frequency fb of spring-mass system).

$$0.05 \le \frac{fa}{fb} \le 0.65 \quad (3)$$

When the frequencies fa and fb are set in accordance with the condition defined by equation (4), the peak frequency of sound absorption becomes significantly smaller than the resonance frequency fb of the spring-mass system. It is acknowledged that the fundamental frequency fa of the bending system becomes adequately smaller than the resonance frequency fb of the spring-mass system in the low-degree mode of elastic vibration, which may support that the above relationships are applicable to the sound absorbing structure for absorbing sound in frequencies below 300 Hz.

$$0.05 \le \frac{fa}{fb} \le 0.40 \quad (4)$$

By appropriately setting parameters to meet the above conditions of equations (3) and (4), it is possible to form a sound absorber achieving a low peak frequency of sound absorption.

Next, specific examples will be described with respect to various conditions for arranging the sound absorber 2 in a room (or a chamber).

The inventor of the present invention performed experiments to measure reverberation times and average sound absorption coefficients by arranging the sound absorber 2 in a room in the following conditions (1) to (5).

(1) The sound absorber 2 is not arranged in the room.
(2) The sound absorber 2 is arranged in the room in such a way that the bottom member 21 thereof is closely attached to the floor.
(3) The sound absorber 2 is arranged in the room in such a way that the bottom member 21 thereof is directed to and positioned opposite to the floor with the space S therebetween.
(4) The sound absorber 2 is arranged in the room in such a way that the vibration member 25 thereof is directed to and positioned opposite to the floor with the space S therebetween.
(5) The sound absorber 2 is arranged in the room in such a way that the vibration member 25 is directed to and positioned opposite to the floor with the space S therebetween, and an urethane foam of 10 mm thickness is entirely adhered to the bottom member 21.

Figure 4A:
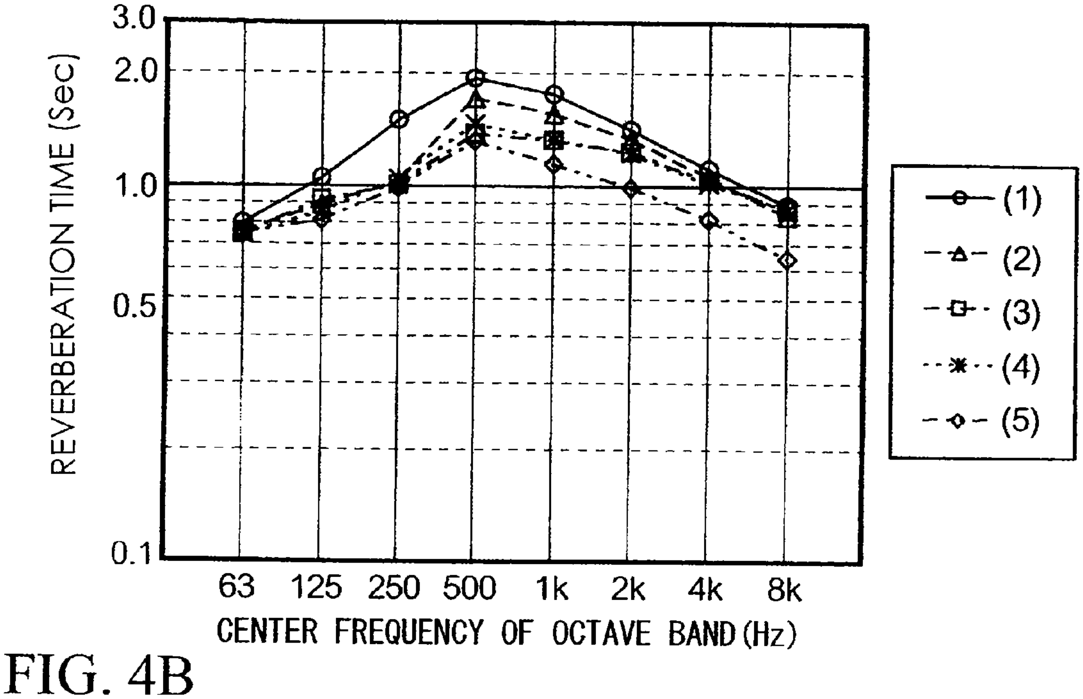
FIG. 4A is a graph showing the result of reverberation times in relation to center frequencies of octave bands with respect to various conditions (1) to (5).
Figure 4B:
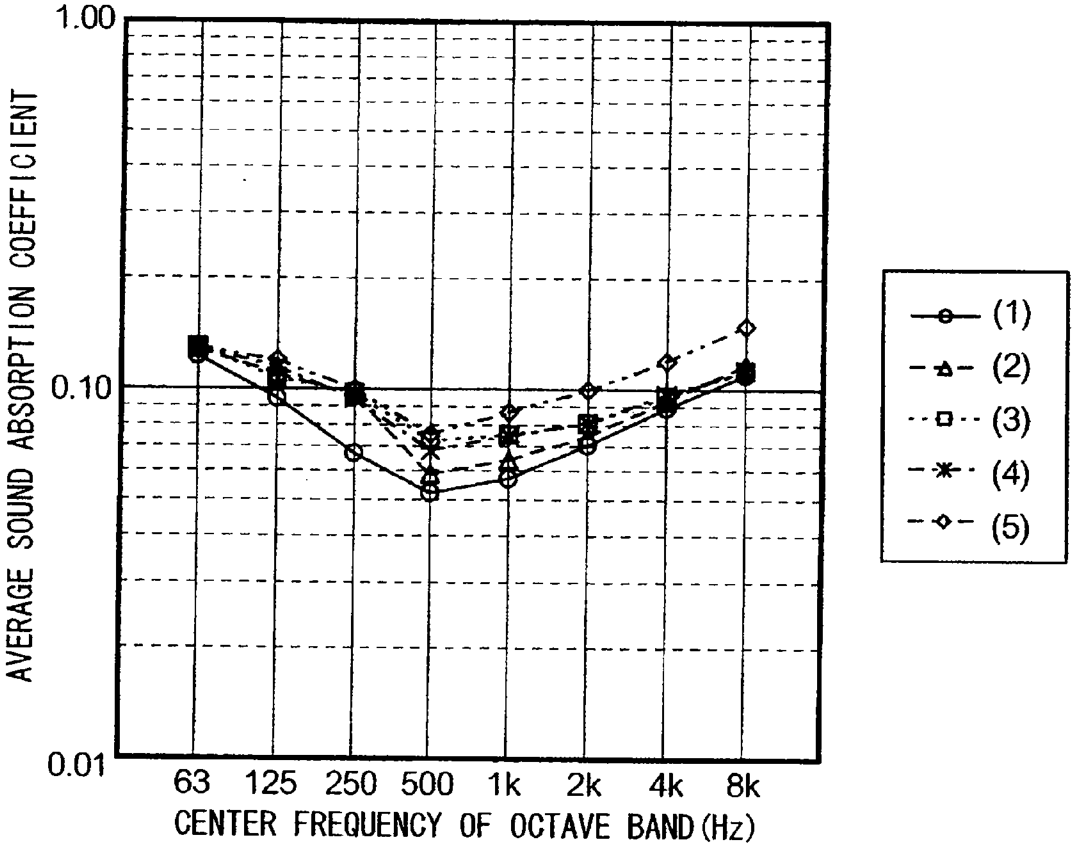
FIG. 4B is a graph showing the result of average sound absorption coefficients in relation to center frequencies of octave bands with respect to various conditions (1) to (5).

Results are shown in Tables 1 and 2, and FIGS. 4A and 4B. Specifically, Table 1 and FIG. 4A show the measurement results regarding reverberation times (seconds) in connection with center frequencies (Hz) of octave bands, while Table 2 and FIG. 4B show the measurement results regarding average sound absorption coefficients in connection with center frequencies (Hz) of octave bands.

In this connection, the floor of the room is a wooden floor, wherein, in the conditions (3) to (5), the sound absorber 2 is positioned opposite to the floor with the space S therebetween such that the distance between the floor and the sound absorber 2 is set to 24 mm. The total volume of the room is 72.83 m$^3$, and the total surface area of the room is 113 m$^2$. Both of the overall area of the vibration member 25 (positioned opposite to the floor) and the overall area of the bottom member 21 (positioned opposite to the floor) are set to 6 m$^2$. In addition, the vibration member 25 is a sheet of 1.5 mm thickness composed of synthetic resin.

TABLE 1

| | Frequency (Hz) | | | | | | | |
|---|---|---|---|---|---|---|---|---|
| Condition | 63 | 125 | 250 | 500 | 1,000 | 2,000 | 4,000 | 8,000 |
| (1) | 0.79 | 1.05 | 1.05 | 1.93 | 1.76 | 1.41 | 1.11 | 0.89 |
| (2) | 0.75 | 0.89 | 1.03 | 1.71 | 1.56 | 1.34 | 1.06 | 0.84 |
| (3) | 0.74 | 0.91 | 1.01 | 1.38 | 1.33 | 1.23 | 1.03 | 0.87 |
| (4) | 0.74 | 0.85 | 1.05 | 1.47 | 1.33 | 1.23 | 1.02 | 0.87 |
| (5) | 0.75 | 0.81 | 0.99 | 1.32 | 1.15 | 0.99 | 0.82 | 0.64 |

TABLE 2

| | Frequency (Hz) | | | | | | | |
|---|---|---|---|---|---|---|---|---|
| Condition | 63 | 125 | 250 | 500 | 1,000 | 2,000 | 4,000 | 8,000 |
| (1) | 0.12 | 0.09 | 0.07 | 0.05 | 0.06 | 0.07 | 0.09 | 0.11 |
| (2) | 0.13 | 0.11 | 0.10 | 0.06 | 0.06 | 0.07 | 0.09 | 0.12 |
| (3) | 0.13 | 0.11 | 0.10 | 0.07 | 0.08 | 0.08 | 0.10 | 0.11 |
| (4) | 0.13 | 0.12 | 0.09 | 0.07 | 0.07 | 0.08 | 0.10 | 0.11 |
| (5) | 0.13 | 0.12 | 0.10 | 0.08 | 0.09 | 0.10 | 0.12 | 0.15 |

Based on the measurement results shown in Tables 1 and 2 and FIGS. 4A and 4B, the inventor may assert the following conclusions (a) to (c) regarding reverberation times and average sound absorption coefficients in consideration of the conditions (1) to (5).

(a) In the condition (2) compared to the condition (1) in which the sound absorber 2 is not arranged in the room, the sound absorber 2 (which is closely attached to the floor of the room) absorbs sound substantially in low frequencies ranging from 125 Hz to 250 Hz.

(b) In the condition (3) compared to the condition (2), the sound absorber 2 (whose bottom member 21 is directed to and positioned opposite to the floor with the space S therebetween) absorbs sound of intermediate frequencies ranging from 500 Hz to 4 kHz.

(c) In the condition (4) in which the vibration member 25 of the sound absorber 2 is directed to and positioned opposite to the floor with the space S therebetween, the sound absorber 2 can demonstrate a significant sound absorption (as demonstrated in the condition (3)) or more; furthermore, the sound absorption thereof is slightly increased in a low frequency of 125 Hz or so.

The measurement results clearly support that the sound absorber 2 can absorb sound by way of the vibration of the vibration member 25 which is caused by sound waves entering into the space S between the vibration member 25 and the wall 10 and which consumes energy of sound waves. The space S between the vibration member 25 and the wall 10 is defined by two boundaries, i.e. the vibration member 25 and the wall 10, wherein sound pressure applied to the space S becomes higher than that in the condition (1) (in which the sound absorber 2 is not arranged) so as to increase energy of sound waves transmitted to the vibration member 25, thus improving the sound absorption efficiency.

In the condition (4) compared to the condition (3) in which the bottom member 21 is positioned opposite to the floor with the space S therebetween, the sound absorber 2 whose vibration member 25 is positioned opposite to the floor with the space S therebetween can demonstrate an adequate sound absorption (as demonstrated in the condition (3)) or more. This supports that the sound absorbing structure of the present embodiment, in which the vibration member 25 of the sound absorber 2 is positioned opposite to the wall 10 with the space S therebetween, can absorb sound with a high efficiency.

In the condition (4), the bottom member 21 of the sound absorber 2 (which is directed to the inside of the room) does not have a direct function as a sound absorbing surface but is simply formed in a planar surface. In view of design (or arrangement), the sound absorber 2 of the present embodiment can be processed in various manners without deteriorating sound absorption characteristics; this makes it possible to optimally design the interior of a room using sound absorbers to suit user's preferences.

Next, variations of the present embodiment will be described with reference to FIGS. 5 to 13.

The present embodiment is described with respect to the situation in which the sound absorbing structure using the sound absorber 2 is adapted to a room (or a chamber); but this is not a restriction. For example, the sound absorbing structure can be applied to vehicles (or automobiles); hence, variations of the sound absorbing structure adapted to various positions of a vehicle will be described below.

Figure 5:
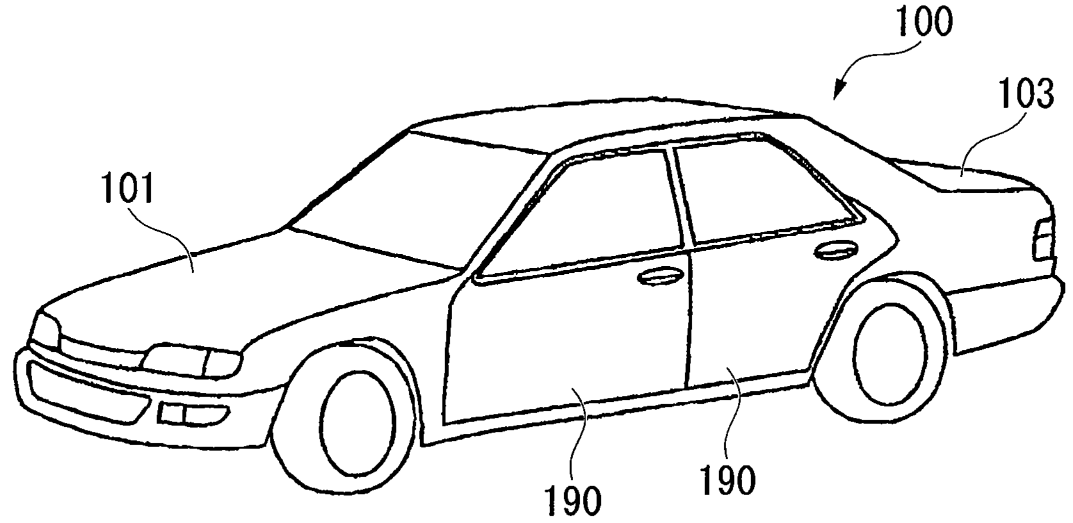
FIG. 5 is a perspective view of a vehicle equipped with a sound absorbing structure using sound absorbers.

FIG. 5 is a perspective view of a vehicle 100 (i.e. a four-door sedan) equipped with the sound absorbing structure. The vehicle 100 is constituted of a hood (or a bonnet) 101, four doors 190, and a trunk door 103, which are fixed to a chassis (i.e. a base of a body structure of the vehicle 100) in a free open/close manner.

Figure 6:
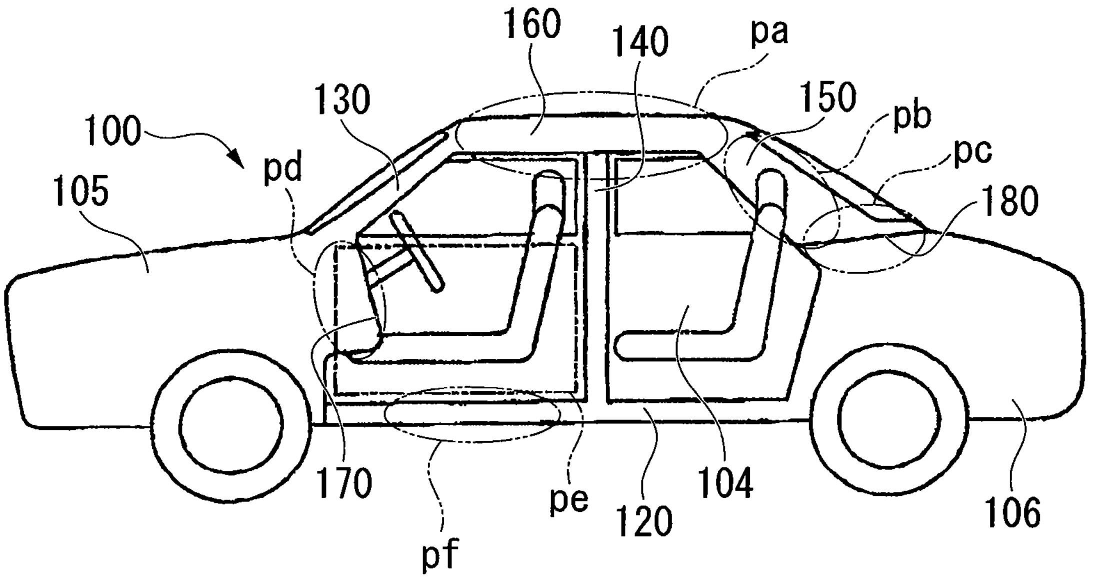
FIG. 6 is a side view of the vehicle shown in FIG. 5.

FIG. 6 shows the detailed constitution of the vehicle 100, which is constituted of a floor 120, a pair of front pillars 130, a pair of center pillars 140, and a pair of rear pillars 150 (which are disposed upwards above the floor 120), a roof 160 (which is supported by the pillars 130, 140, and 150, an engine partition board (or a dash panel) 170 for partition between a compartment 104 and an engine space 105, and a rear package tray 180 for partition between the compartment 104 and a trunk 106.

Specifically, first to sixth variations are described such that the sound absorbing structure using the sound absorber 2 is attached to the roof 160, the pillars 130, 140, and 150, the rear package tray 180, an instrument panel 171 (which is arranged on the engine partition board 170), the doors 190, and the floor 120.

(1) First Variation

In the first variation, the sound absorbing structure is attached to the roof 160 of the vehicle 100.

Figure 7:
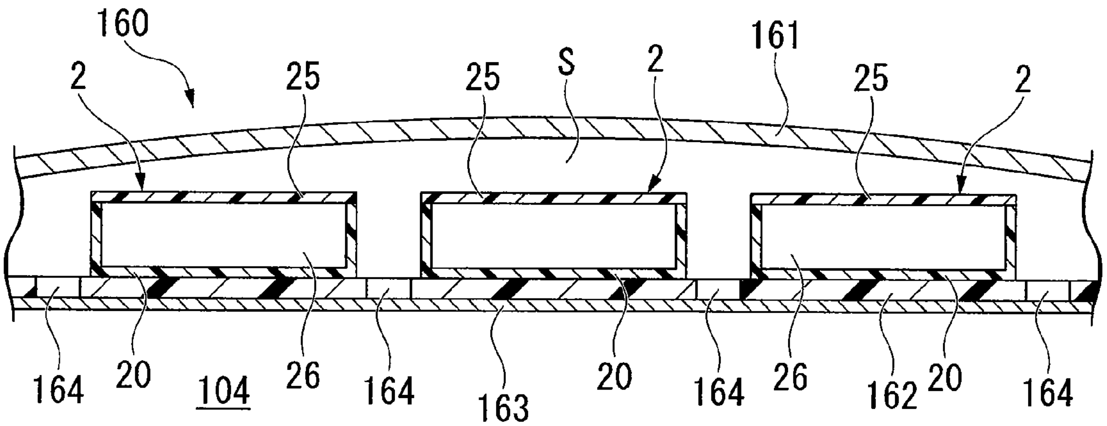
FIG. 7 is a longitudinal sectional view of a roof of the vehicle for installing the sound absorbing structure in accordance with a first variation of the first embodiment.
Figure 8:
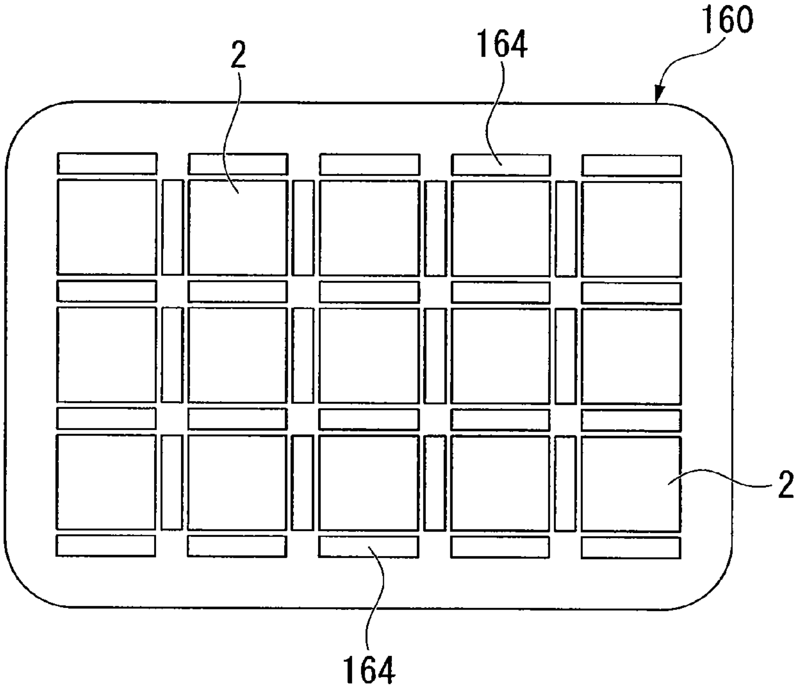
FIG. 8 diagrammatically shows an arrangement of sound absorbers included in the sound absorbing structure installed in the roof of the vehicle.

FIG. 7 is a longitudinal sectional view of the roof 160 with respect to a section "pa" shown in FIG. 6, which is viewed in the width direction of the vehicle 100, and FIG. 8 shows an arrangement of the sound absorbers 2 included in the sound absorbing structure attached to the roof 160 in view of the compartment 104. The roof 160 is constituted of a roof outer panel 161 (forming a part of the chassis, i.e. the base of the body structure of the vehicle 100) and a roof inner panel 162 composed of a polypropylene resin (which is fixed to the roof outer panel 161 via clipping, not shown). A surface material 163 composed of a cloth material transmitting sound pressure therethrough is attached to the roof inner panel 162 in view of the compartment 104.

The housings 20 of the sound absorbers 2 are attached to the roof inner panel 162 so as to form a space S between the vibration members 25 and the roof outer panel 161 (forming a boundary of the compartment 104). A plurality of rectangular-shaped communication holes 164 (forming communications among the roof outer panel 161, the roof inner panel 162, and the compartment 104) is formed in the roof inner panel 162.

When the roof 160 is equipped with the sound absorbing structure, sound generated in the compartment 104 is transmitted through the communication holes 164 so as to enter into the space defined between the roof outer panel 161 and the roof inner panel 162, wherein sound also enters into the space S defined between the vibration members 25 of the sound absorbers 2 and the roof outer panel 161. As shown in FIGS. 2 and 3, the vibrator 25 of the sound absorber 2 vibrates due to the pressure difference between the sound pressure applied to the space S and the internal pressure of the air layer 26, whereby energy of sound waves entering into the space S is consumed and absorbed by way of the vibration of the vibration member 25.

As shown in FIG. 8, the sound absorbers 2 can be arranged to cover the overall area of the roof 160. Alternatively, they can be arranged in a limited area of the roof 160 receiving sound generated in the compartment 104 or in a center area of the roof 160 in a scattering manner. Moreover, they can be selectively arranged in areas where the sound pressure in the compartment 104 is high.

(2) Second Variation

In the second variation, the sound absorbing structure is attached to the rear pillar 150 of the vehicle 100.

Figure 9:
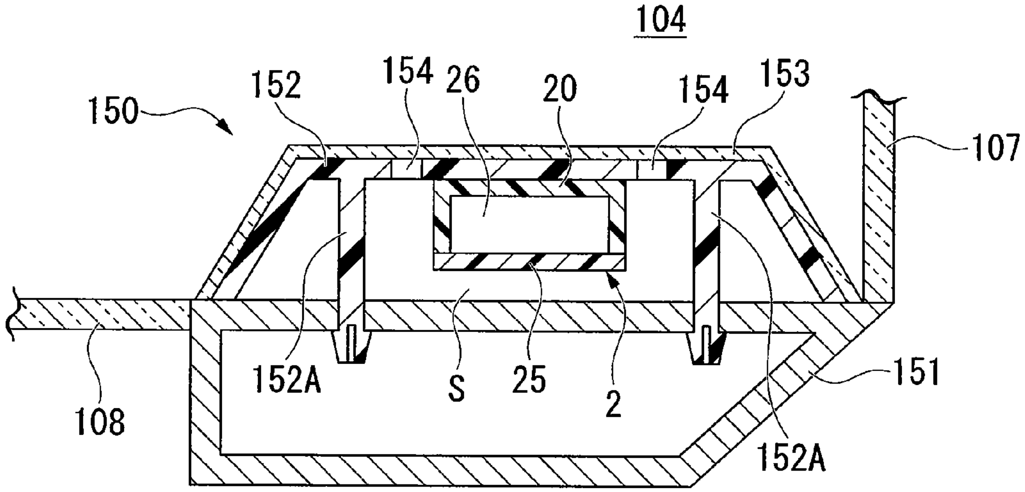
FIG. 9 is a sectional view of a rear pillar of the vehicle for installing the sound absorbing structure in accordance with a second variation of the first embodiment.

FIG. 9 is a sectional view showing the real pillar 150 for installing the sound absorbing structure with respect to a section "pb" shown in FIG. 6. The rear pillar 150 is constituted of a rear pillar outer panel 151 (forming a part of the chassis) and a rear pillar inner panel 152. The rear pillar inner panel 152 is fixed to the rear pillar outer panel 151 via pins 152A. A rear glass 107 is fixed to one end of the rear pillar outer panel 151 via seal members (not shown), while a door glass 108 is fixed to another end of the rear pillar outer panel 151 via seal members (not shown). A surface material 153 (which is a cloth material transmitting sound pressure applied thereto) is attached to the rear pillar inner panel 152 in view of the compartment 104.

The housing 20 of the sound absorber 2 is attached to the rear pillar inner panel 152 such that the space S is formed between the vibration member 25 and the rear pillar outer panel 151 (forming a boundary of the compartment 104). A plurality of communication holes 154 is formed in the rear pillar inner panel 152 so that the compartment 104 communicates with the inner space of the rear pillar 150 (defined between the rear pillar outer panel 151 and the rear pillar inner panel 152).

In the rear pillar 150 equipped with the sound absorbing structure, sound generated in the compartment 104 enters into the inner space defined between the rear pillar outer panel 151 and the rear pillar inner panel 152 via the communication holes 154, by which sound enters into the space S between the vibration member 25 and the rear pillar outer panel 151. Thus, the vibration member 25 of the sound absorber 2 vibrates due to the pressure difference between the sound pressure applied to the space S and the internal pressure of the air layer 26 of the sound absorber 2, whereby energy of sound waves entering into the space S is consumed by way of the vibration of the vibration member 25, thus absorbing sound.

(3) Third Variation

In the third variation, the sound absorbing structure is attached to the rear package tray 180.

Figure 10:
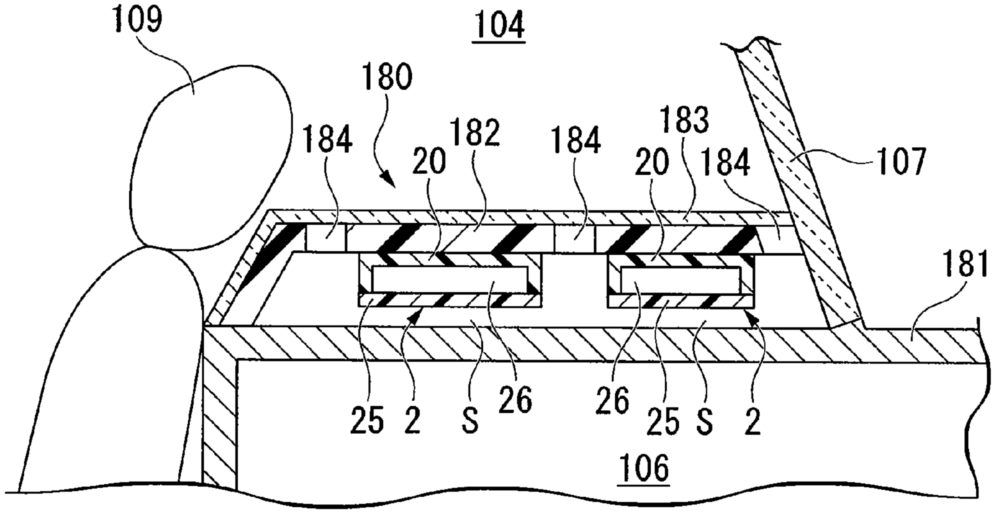
FIG. 10 is a sectional view of a rear package tray of the vehicle for installing the sound absorbing structure in accordance with a third variation of the first embodiment.

FIG. 10 is a sectional view showing the rear package tray 180 for installing the sound absorbing structure with respect to a position "pc" shown in FIG. 6. The rear package tray 180 is constituted of a trunk partition board 181 (forming a part of the chassis) and a rear package inner panel 182 which is attached to the trunk partition board 181. The rear glass 107 is fixed to one end of the trunk partition board 181, while a rear seat 109 is fixed to another end of the trunk partition board 181. A surface material 183 which is a cloth material transmitting sound pressure therethrough is attached to the rear package inner panel 182 in view of the compartment 104.

The housings 20 of the sound absorbers 2 are attached to the rear package inner panel 182 such that the spaces S are formed between the vibration members 25 and the trunk partition board 181 (forming a boundary of the compartment 104). A plurality of communication holes 184 is formed in the rear package inner panel 182 such that the compartment 104 communicates with the inner space defined between the trunk partition board 181 and the rear package inner panel 182.

In the rear package tray 180 equipped with the sound absorbing structure, sound generated in the compartment 104 enters into the inner space between the trunk partition board 181 and the rear package inner panel 182 via the communication holes 184, by which sound further enters into the spaces S between the vibration members 25 of the sound absorbers 2 and the trunk partition board 181. Thus, the vibration members 25 of the sound absorbers 2 vibrate due to the pressure differences between the sound pressure applied to the spaces S and the internal pressures of the air layers 26 of the sound absorber 2, whereby energy of sound waves entering into the spaces S is consumed by way of the vibrations of the vibration members 25, thus absorbing sound.

(4) Fourth Variation

In the fourth variation, the sound absorbing structure is attached to the instrument panel 171.

Figure 11:
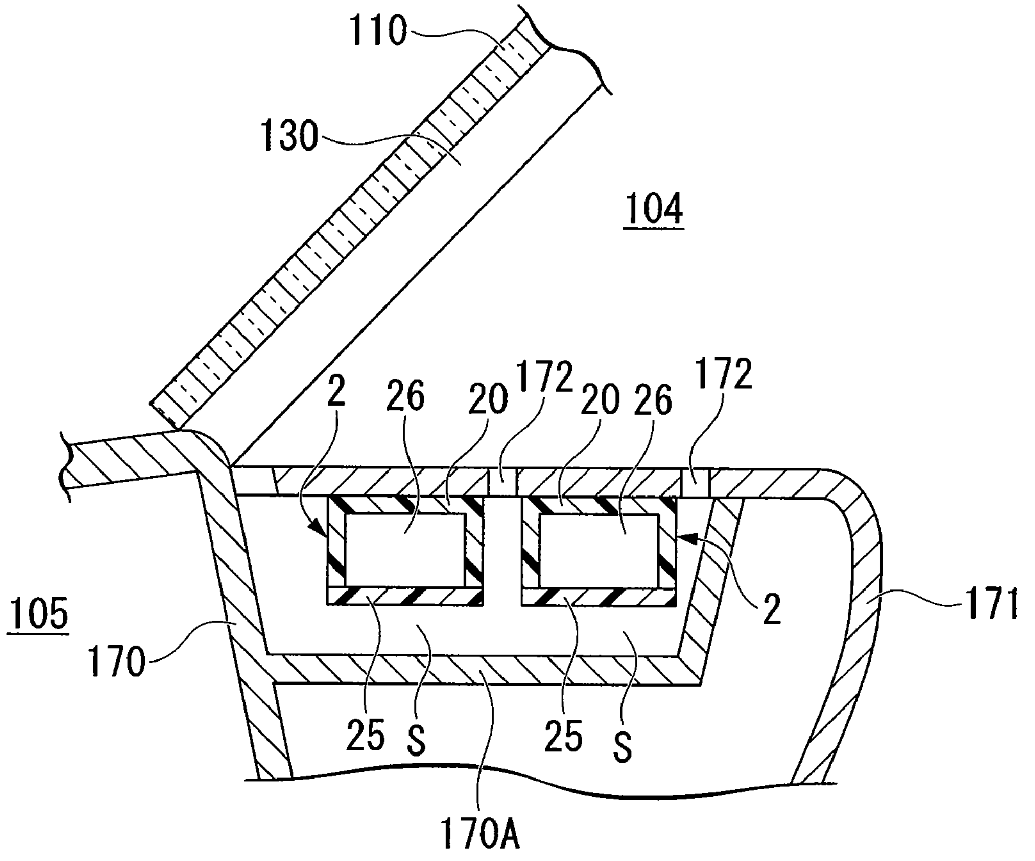
FIG. 11 is a sectional view of an instrument panel of the vehicle for installing the sound absorbing structure in accordance with a fourth variation of the first embodiment.

FIG. 11 is a sectional view showing the instrument panel 171 for installing the sound absorbing structure with respect to a position "pd" shown in FIG. 6. The instrument panel 171 is attached to the engine partition board 170 (forming a part of the chassis). A front glass 110 is fixed to the engine partition board 170 together with the front pillars 130. A reflection board 170A is elongated from the engine partition board 170 so as to form an inner space with the instrument panel 171.

The housings 20 of the sound absorbers 2 are attached to the backside of the instrument panel 171 such that the spaces S are formed between the vibration members 25 and the reflection board 170A of the engine partition board 170 (forming a boundary of the compartment 104). A plurality of communication holes 172 is formed in the instrument panel 171 such that the compartment 104 communicates with the inner space defined between the instrument panel 171 and the reflection board 170A.

In the instrument panel 171 equipped with the sound absorbing structure, sound generated in the compartment enters into the inner space between the instrument panel 171 and the reflection board 170A via the communication holes 172, by which sound further enters into the spaces S between the vibration members 25 and the reflection board 170A. Thus, the vibration members 25 vibrate due to the pressure differences between the sound pressure applied to the spaces S and the internal pressures of the air layers 26 of the sound absorbers 2, wherein energy of sound waves entering into the spaces S is consumed by way of the vibrations of the vibration members 25, thus absorbing sound.

(5) Fifth Variation

In the fifth variation, the sound absorbing structure is attached to the door 190.

Figure 12:
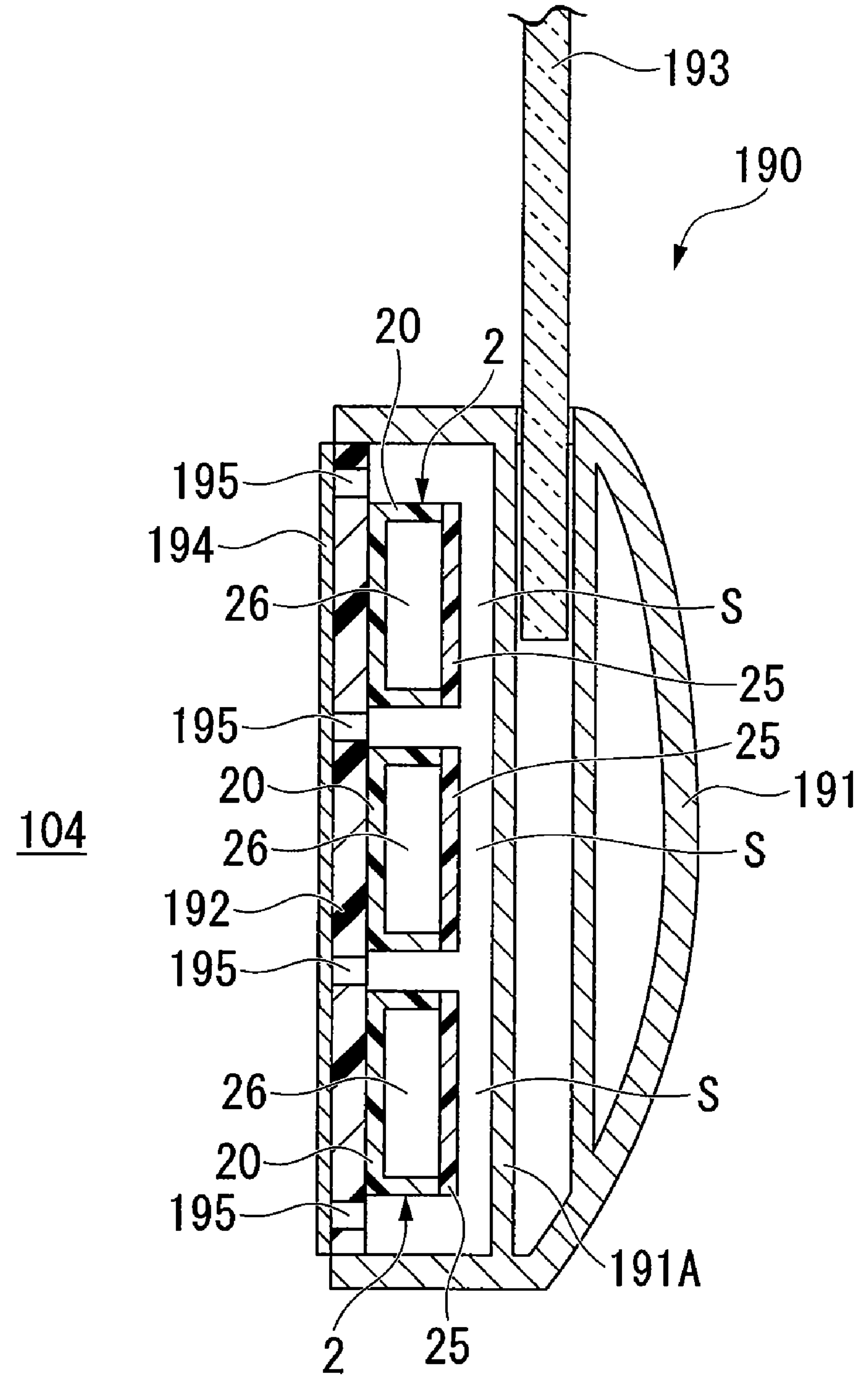
FIG. 12 is a sectional view of a door of the vehicle for installing the sound absorbing structure in accordance with a fifth variation of the first embodiment.

FIG. 12 is a sectional view showing the door 190 for installing the sound absorbing structure with respect to a position "pe" shown in FIG. 6. The door 190 is constituted of a door outer panel 191 and a door inner panel 192 (which is fixed to the door outer panel 191). A door glass (or a window) 193 is installed in one end of the door outer panel 191 in a retractable manner. A surface material 194 which is a cloth material transmitting sound pressure therethrough is attached to the door inner panel 192 in view of the compartment 104. In addition, a glass storage unit 191A for storing the door glass 193 in a window open mode is installed in the door outer panel 191.

The housings 20 of the sound absorbers 2 are attached to the door inner panel 192 such that the spaces S are formed between the vibration members 25 and the wall of the glass storage unit 191A (which forms a boundary of the compartment 104) installed in the door outer panel 191. A plurality of communication holes 195 is formed in the door inner panel 192 such that the compartment 104 communicates with the inner space defined between the door inner panel 192 and the wall of the glass storage unit 191A.

In the door 190 equipped with the sound absorbing structure, sound generated in the compartment 104 enters into the inner space between the door inner panel 192 and the wall of the glass storage unit 191A via the communication holes 195, by which sound further enters into the spaces S between the vibration members 25 and the wall of the glass storage unit 191A. Thus, the vibration members 25 vibrate due to the pressure differences between the sound pressure applied to the spaces S and the internal pressures of the air layers 26 of the sound absorbers 2, wherein energy of sound waves entering into the spaces S is consumed by way of the vibrations of the vibration members 25, thus absorbing sound.

(6) Sixth Variation

In the sixth variation, the sound absorbing structure is attached to the floor 120.

Figure 13:
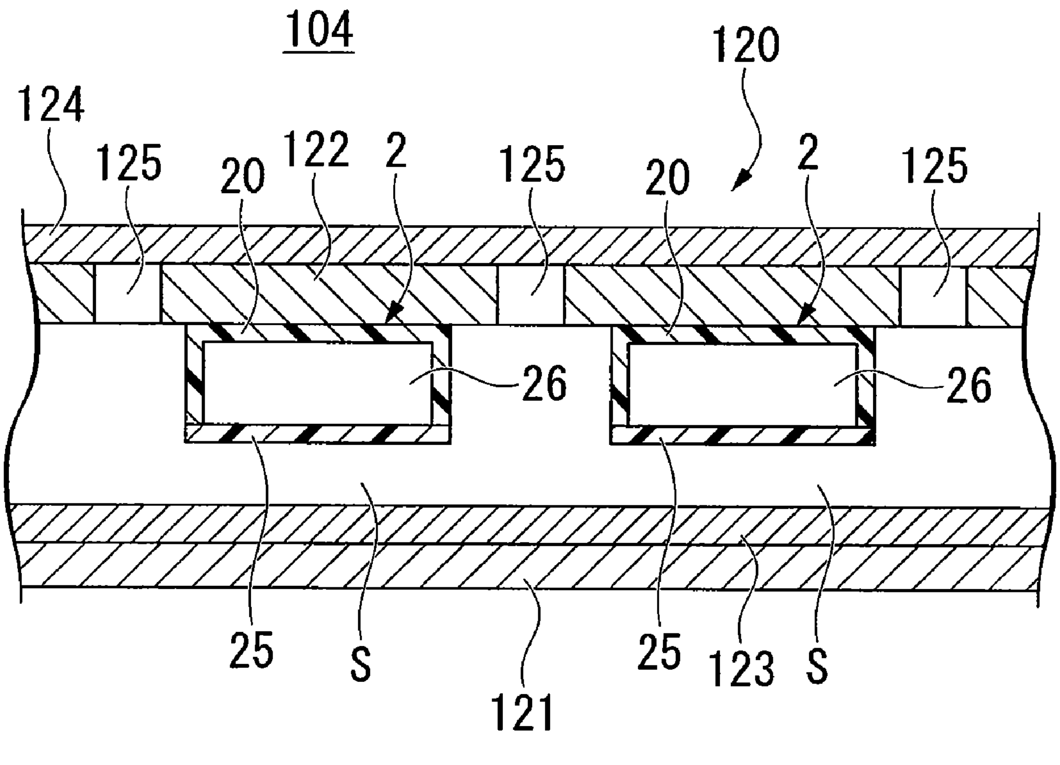
FIG. 13 is a sectional view of a floor of the vehicle for installing the sound absorbing structure in accordance with a sixth variation of the first embodiment.

FIG. 13 is a sectional view showing the floor 120 for installing the sound absorbing structure with respect to a position "pf" shown in FIG. 6. The floor 120 is constituted of a floor outer panel 121 (forming a part of the chassis), a floor inner panel 122 (which is positioned in proximity to the floor outer panel 121 with a prescribed gap therebetween), a felt material 123 adhered onto the floor outer panel 121, and a carpet 124 having an acoustic transmissivity which is adhered onto the floor inner panel 122 in view of the compartment 104.

The housings 20 of the sound absorbers 2 are attached to the floor inner panel 122 such that the spaces S are formed between the vibration members 25 and the floor outer panel 121 (forming a boundary of the compartment 104). A plurality of communication holes 125 is formed in the floor inner panel 122 such that the compartment 104 communicates with the inner space defined between the floor outer panel 121 and the floor inner panel 122.

In the floor 120 equipped with the sound absorbing structure, sound generated in the compartment 104 enters into the inner space between the floor outer panel 121 and the floor inner panel 122 via the communication holes 125, by which sound further enters into the spaces S between the vibration members 25 and the floor outer panel 121. Thus, the vibration members 25 of the sound absorbers 2 vibrate due to the pressure differences between the sound pressure applied to the spaces S and the internal pressures of the air layers 26 of the sound absorbers 2, whereby energy of sound waves entering into the spaces S is consumed by way of the vibration of the vibration members 25, thus absorbing sound.

When the sound absorbing structure of the present embodiment is applied to the vehicle 100, it absorbs sounds of relatively low frequencies (i.e. sounds of specific acoustic modes) so as to remarkably reduce engine noise, road noise, wind noise, etc.

Since the sound absorbing structure is installed in the vehicle 100 in such a way that the sound absorbers 2 are each arranged in a reverse manner in which the vibration members 25 are not directed toward the compartment 104, it is possible to prevent sunlight and air from directly affecting the vibration members 25; this makes it easy to select materials in terms of weather resistance. That is, it is possible to increase the number of materials usable for the vibration members 25, and it is unnecessary to add additives to materials in order to increase weatherproof properties; hence, it is possible to reduce the manufacturing cost and environmental loads.

Since the present embodiment and variations do not need exterior designs, it is possible to add exterior design parts or mechanical parts by use of the bottom member 21 of the housing 20.

When the sound absorbers 2 are each installed in the vehicle 100 in a normal mode in which the vibration members 25 are directed toward the compartment 104, the vibration members 25 may be likely destroyed due to the external force applied thereto by passengers. The present embodiment is designed to evade such a risk and to improve the durability of the sound absorbing structure.

All the variations are designed such that the space S is formed between the vibration member 25 of the sound absorber 2 and the surface of a prescribed member (forming a boundary of the compartment 104) so that the bottom member 21 of the housing 20 is fixed to the opposite surface; but this is not a restriction. That is, it is possible to fix the bottom member 21 of the sound absorber 2 by means of the fixing member 3 or the like so as to form the space S between the vibration member 25 and the surface of the prescribed member, for example.

2. Second Embodiment

The sound absorber 2 can be further modified in a variety of ways other than the first embodiment and variations in accordance with a second embodiment of the present invention; hence, variations of the second embodiment will be described with reference to FIGS. 14 to 18, wherein parts identical to those shown in FIGS. 1 to 3 are designated by the same reference numerals.

(1) First Variation

Figure 14:
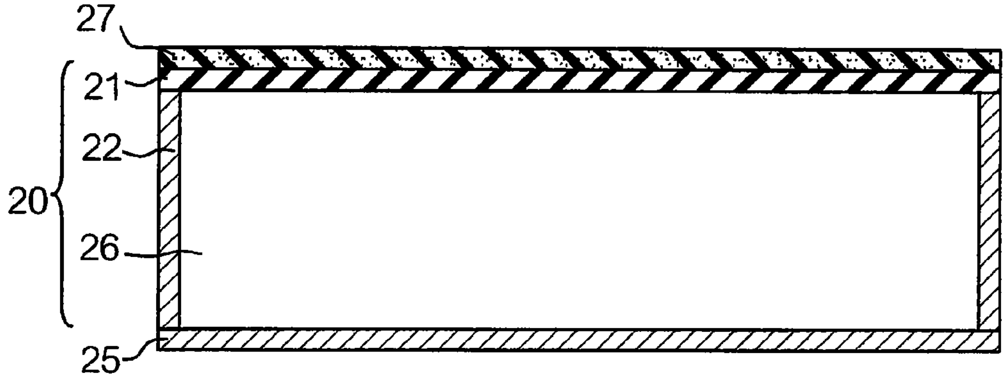
FIG. 14 is a cross-sectional view of a sound absorber in accordance with a first variation of a second embodiment of the present invention.

FIG. 14 shows a first variation of the second embodiment, in which a porous layer 27 (composed of a porous material) is attached to the exterior surface of the sound absorber 2 opposite to the vibration member 25, i.e. the exterior surface of the housing 20 opposite to the surface of the vibration member 25 directly facing the boundary of the room, such as the surface of the bottom member 21. The porous layer 27 absorbs sound at intermediate and higher frequencies. That is, the sound absorber 2 shown in FIG. 14 may function in a similar manner to the sound absorber 2 of the condition (5).

(2) Second Variation

Figure 15:
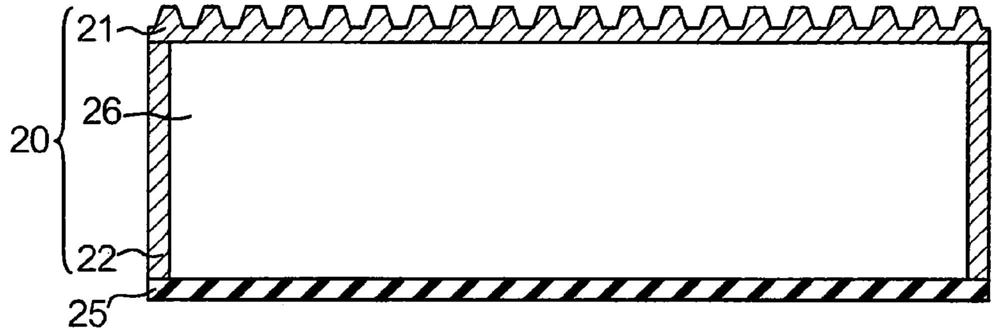
FIG. 15 is a cross-sectional view of a sound absorber in accordance with a second variation of the second embodiment.

FIG. 15 shows a second variation of the second embodiment, in which irregularities (e.g. small recesses and small projections) are formed on the exterior surface of the housing 20 (i.e. the surface opposite to the surface of the vibration member 25 directing facing the boundary of the room, such as the surface of the bottom member 21 of the housing 20 for directly receiving sound from a sound source). Irregularities of the bottom member 21 spread sound at intermediate and high frequencies.

(3) Third Variation

Figure 16:
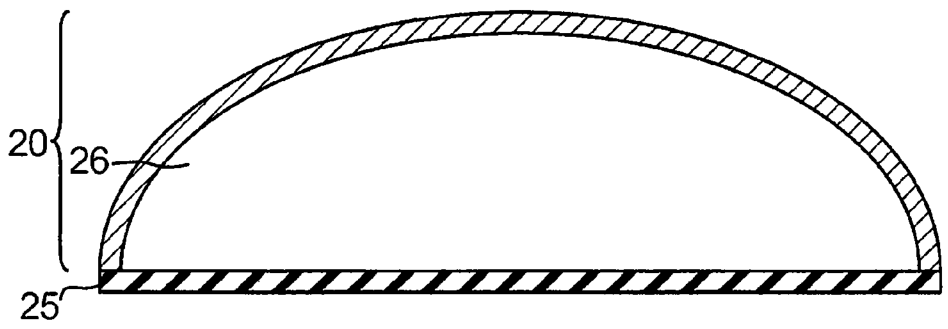
FIG. 16 is a cross-sectional view of a sound absorber in accordance with a third variation of the second embodiment.

FIG. 16 shows a third variation of the second embodiment, in which the housing 20 has a curved shape relative to the vibration member 25 having a flat shape in the sound absorber 2.

It is possible to further form irregularities on the exterior surface of the housing 20 in a similar manner to the second variation shown in FIG. 15.

It is possible to further form the porous layer 27 on the exterior surface of the bottom member 21 of the housing 20 shown in FIG. 14. Similarly, it is possible to further form the porous layer 27 on the exterior surface of the housing 20 shown in FIG. 16 and on the exterior surface of the housing 20 having irregularities.

The sound absorber 2 is not necessarily formed in a rectangular parallelepiped shape; hence, it can be formed in other shapes such as circular cylindrical shapes and polygonal prism shapes.

In the housing 20 of the sound absorber 2 shown in FIG. 14, it is possible to replace the porous layer 27 with a holey board or a resonance tube operable based on Helmholtz resonance.

(4) Fourth Variation

Figure 17:
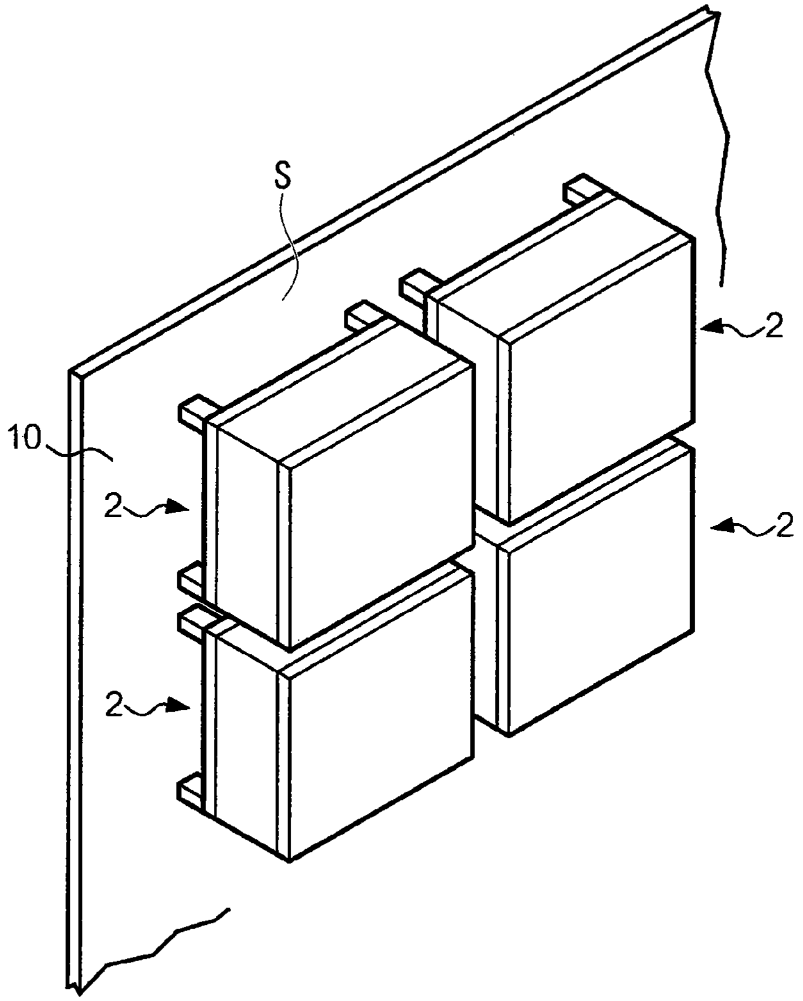
FIG. 17 is a perspective view of a sound absorbing structure including sound absorbers in accordance with a fourth variation of the second embodiment.

FIG. 17 shows a fourth variation of the second embodiment, in which a plurality of sound absorbers 2 is positioned to adjoin each other on the wall 10 (or a ceiling or a floor) with a prescribed distance therebetween. The prescribed distance is determined in response to frequency bands subjected to sound absorption. Specifically, the distance is increased when the frequency range up to low bands is subjected to sound absorption, while the distance is reduced when the frequency range of high bands is subjected to sound absorption, thus controlling frequency bands of sounds entering into the space S between the sound absorbers 2 and the wall 10 of the room (i.e. the boundary of the room). This makes it possible to freely control frequency bands of sounds, which are absorbed in the rear sides of the sound absorbers 2, independently of the thickness of the space S between the vibration members 25 and the wall 10.

The sound absorber 2 is not necessarily attached to the wall, ceiling, or floor of a room by means of the fixing members 3 including the plane fasteners 32A as shown in FIG. 3; hence, the sound absorber 2 can be fixed to the wall, ceiling, or floor by means of pillar spacers and adhesives.

All the bottom members 21 of the sound absorbers 2 (which adjoin each other with a prescribed distance therebetween and which are directed to the inside of a room) can be collectively covered with finish materials (e.g. jersey nets, curtain cloths, non-woven fabrics, and mesh sheets) having acoustic transmissivity and acoustic flow resistance, thus forming a visible single surface (including plural sound absorbers 2). This further improves the sound absorption due to acoustic flow resistance of finishing materials.

(5) Fifth Variation

The support members 31 used for the fixation of the sound absorber 2 (see FIG. 3) can be formed in a stretchable shape, which allows the user to freely adjust the distance between the vibration member 25 and the wall 10.

Figure 18:
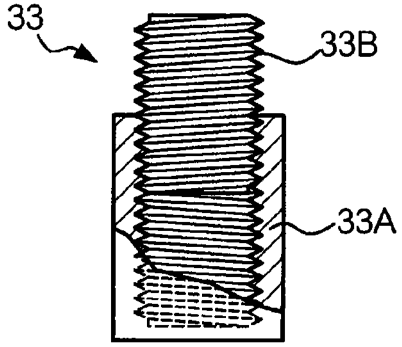
FIG. 18 is a side view partly in cross section showing the constitution of a stretchable support member used for the fixation of the sound absorber in accordance with a fifth variation of the second embodiment.

FIG. 18 shows a stretchable support member 33, which is constituted of a base 33A and an adjusting section 33B. The base 33A is a hollow cylinder having an opening, the opposite side of which is closed. An internal thread is formed in the inside of the base 33A. The adjusting section 33B has a circular cylindrical shape in the exterior appearance. An external thread is formed on the exterior surface of the adjusting section 33B. The adjusting section 33B is screwed into the base 33A such that the external thread of the adjusting section 33B engages with the internal thread of the base 33A. By rotating the adjusting section 33B, it is possible to adjust the distance between the bottom of the base 33A and the tail end of the adjusting section 33B (which is positioned opposite to the bottom of the base 33A).

By replacing the support member 31 with the stretchable support member 33, it is possible for the user to freely adjust the distance between the vibration member 25 of the sound absorber 2 and the wall 10. This makes it possible to freely adjust sound absorption characteristics.

The distance between the vibration member 25 and the wall 10 can be set in response to frequency bands subjected to sound absorption. Specifically, the distance is increased when low bands are subjected to sound absorption, while the distance is reduced when high bands are subjected to sound absorption, thus controlling frequency bands of sounds entering into the space S between the sound absorber 2 and the wall 10 of the room (i.e. the boundary of the room). This makes it possible to freely control frequency bands of sounds absorbed by the sound absorber 2. Pursuant to the fourth variation of FIG. 17, it is possible to arrange a plurality of sound absorbers 2 adjoining together with a prescribed distance which is determined independently of the distance between the vibration member 25 and the wall 10, whereby it is possible to achieve optimum sound absorption characteristics.

The above mechanism for adjusting the distance between the vibration member 25 of the sound absorber 2 and the wall 10 is not necessarily limited to the stretchable support member 33, which is illustrative and not restrictive.

In addition, the vibration member 25 of the sound absorber 2 is not necessarily positioned in parallel with the wall 10; that is, the vibration member 25 can be fixed to the wall while it is inclined in a position relative to the wall 10.

3. Simulation Results

In the embodiments and variations, the sound absorber 2 is basically constituted of the housing 20 having a rectangular shape, the vibration member 25 for closing the opening of the housing 20, and the air layer 26 formed inside of the housing 20; but this is not a restriction. That is, the housing 20 is not necessarily formed in the rectangular shape but can be formed in other shapes such as circular shapes and polygonal shapes. It is preferable that, irrespective of the shape of the housing 20, a concentrated mass (which is used for controlling vibration conditions) be formed in the center portion of the vibration member 25.

A sound absorbing mechanism adapted to the sound absorber 2 is generally constituted of the spring-mass system and the bending system. The inventor of this application performed experiments to measure sound absorption coefficients in resonance frequencies by changing surface densities of the vibration member 25.

Figure 19:
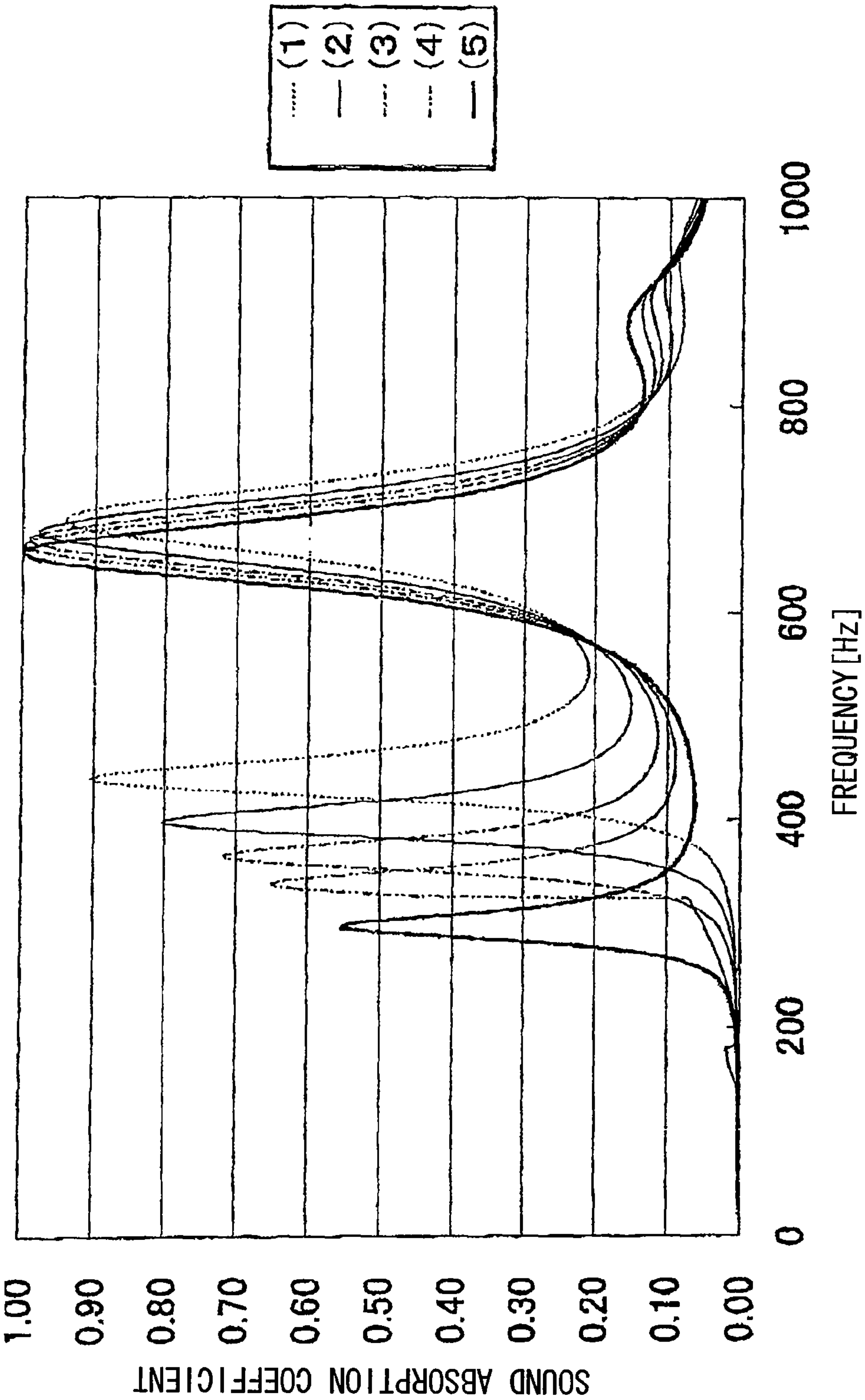
FIG. 19 is a graph showing simulation results of sound absorption coefficients with respect to frequencies in different densities of vibration members of sound absorbers.

FIG. 19 shows simulation results in the measurement of vertical incident absorption coefficients of the sound absorber 2 while changing the surface density of the center portion of the vibration member 25, wherein the vibration member 25 (having length/breadth dimensions of 100 mm×100 mm and a thickness of 0.85 mm) is attached to the housing 20 whose air layer 26 has length/breadth dimensions of 100 mm×100 mm and a thickness of 10 mm, and wherein the center portion of the vibration member 25 has length/breadth dimensions of 20 mm×20 mm and a thickness of 0.85 mm. The simulation is performed in accordance with JIS A 1405-2 (i.e. transfer functions defined in the second part of the measurement of sound absorption coefficients and impedances in sound pipes), wherein the sound field of a sound chamber arranging the sound absorber 2 therein is measured by the finite element method so as to determine transfer functions, thus calculating sound absorption characteristics.

Simulation results shown in FIG. 19 are produced in various conditions, in which the surface density of the center portion of the vibration member 25 is set to (1) 399.5 [g/$m^2$], (2) 799 [g/$m^2$], (3) 1,199 [g/$m^2$], (4) 1,598 [g/$m^2$], and (5) 2,297 [g/$m^2$], while the surface density of the peripheral portion is set to 799 [g/$m^2$]. In addition, the average density of the vibration member 25 is set to (1) 783 [g/$m^2$], (2) 799 [g/$m^2$], (3) 815 [g/$m^2$], (4) 831 [g/$m^2$], and (5) 863 [g/$m^2$].

Simulation results clearly show that spikes appear in sound absorption coefficients at frequencies ranging from 300 Hz to 500 Hz and at a frequency of about 700 Hz.

Spikes of sound absorption coefficients occur at the frequency of about 700 Hz occur due to the resonance of the spring-mass system which is defined by the mass of the vibration member 25 and the spring coefficient of the air layer 26. The sound absorber 2 absorbs sound with a peak sound absorption coefficient at the resonance frequency of the spring-mass system, wherein the total mass of the vibration member does not change so much even when the surface density is increased in the center portion of the vibration member 25; this indicates that no substantial variation occurs in the resonance frequency of the spring-mass system.

Spikes of sound absorption coefficients occur at frequencies of 300 Hz to 500 Hz due to the resonance of the bending system formed by bending vibration of the vibration member 25. Peak sound absorption coefficients occur in the sound absorber 2 at frequencies lower than the resonance frequency of the bending system, which becomes lower as the surface density of the center area of the vibration member 25 becomes large.

Generally speaking, the resonance frequency of the bending system is determined by equations of motion dominant to elastic vibration of the vibration member 25 so that it varies in inverse proportion to the surface density of the vibration member 25. The resonance frequency is greatly affected by the density of the loop of natural vibrations (whose amplitudes become maximal). The above simulation is performed such that the center portion of the vibration member 25 is formed with different surface densities with respect to the region of the loop of the 1×1 natural mode, thus varying the resonance frequency of the bending system.

According to simulation results, when the surface density is increased in the center portion compared to the peripheral portion of the vibration member 25, frequencies corresponding to peak sound absorption coefficients are shifted to further lower frequencies. This indicates that the sound absorber 2 is capable of shifting a part of the frequencies corresponding to peak sound absorption coefficients to lower frequencies or higher frequencies.

The sound absorber 2 is capable of shifting (or varying) frequencies corresponding to peak sound absorption coefficients by varying the surface density of the center portion of the vibration member 25. Thus, it is possible to lower the frequency range of sound absorption without substantially varying the total mass of the sound absorber 2 in comparison with another example of the sound absorber 2 having a heavy weight in which the vibration member 25 is formed in a flat shape and composed of the same material as the housing 20.

Thus, the sound absorbing structure of the present invention can cope with variations of noise characteristics of the compartment 104 due to variations of sound absorption in the compartment 104 and the trunk 106 (caused by changing the number of passengers or by changing the amount and shape of luggage) and variations of noises (caused by changing tires or due to variations of road conditions).

Furthermore, it is possible to fill the air layer 26 of the sound absorber 2 with porous sound absorbing materials (e.g. resin foam, felt, polyester wool, cotton fibers, etc.), thus increasing peak values of sound absorption coefficients.

4. Industrial Applicability

The sound absorbing structure (i.e. the sound absorber 2) of the present invention is applicable to various sound chambers for controlling acoustic characteristics, such as soundproof rooms, halls, theaters, listening rooms of audio devices, meeting (or conference) rooms, and spaces for keeping transport machines, as well as housings of speakers and musical instruments.

Lastly, the present invention is not necessarily limited to the aforementioned embodiments and variations, which can be further modified in a variety of ways within the scope of the invention as defined by the appended claims.

What is claimed is:

1. A sound absorbing structure comprising:

a rigid housing having a predetermined depth and an opening of a predetermined size;

a vibration member that is arranged on the opening of the housing so as to form a cavity in the housing, the cavity having a spring coefficient and the vibration member having a mass, wherein the predetermined depth, the predetermined size of the opening and mass of the vibration member are determined to absorb at least one predetermined frequency of sound; and a fixing member for fixing the sound absorbing structure to a surface with the vibration member facing the surface, the fixing member is configured to fix the sound absorbing structure to the surface with a predetermined distance to form a space between the vibration member and the surface, and the space is positioned opposite side of the cavity with respect to the vibration member.

2. The sound absorbing structure according to claim 1, wherein irregularities are formed on an exterior surface of the housing.

3. The sound absorbing structure according to claim 1, wherein a curvature is formed on an exterior surface of the housing.

4. The sound absorbing structure according to claim 1, wherein the sound absorbing structure further includes a porous layer composed of a porous material, which is attached to an exterior surface of the housing.

5. The sound absorbing structure according to claim 1, wherein the fixing member is configured to fix the sound absorbing structure to the surface with an adjustable distance between the vibration member and the surface.

6. A sound absorbing structure comprising:

a plurality of sound absorbers that are arranged to adjoin together with a prescribed distance therebetween, wherein each of the sound absorbers comprises:

a housing having a predetermined depth and an opening of a predetermined size, and a vibration member that is arranged on the opening so as to form a cavity in the housing, the cavity having a spring coefficient and the vibration member having a mass, the vibration member forming a bending system and the vibration member and the cavity forming a spring-mass system, wherein the predetermined depth, the predetermined size of the opening and mass of the vibration member are determined to absorb at least one predetermined frequency of sound, and wherein a fundamental frequency fa of the bending system and the resonance frequency fb of spring-mass system satisfy:

$$0.05 \leq \frac{fa}{fb} \leq 0.65.$$

* * * * *